United States Patent
Slovin et al.

(10) Patent No.: US 10,770,657 B2
(45) Date of Patent: Sep. 8, 2020

(54) HIGH RELIABILITY PHASE-CHANGE MATERIAL (PCM) RADIO FREQUENCY (RF) SWITCH USING TRAP-RICH REGION

(71) Applicant: Newport Fab, LLC, Newport Beach, CA (US)

(72) Inventors: Gregory P. Slovin, Irvine, CA (US); Nabil El-Hinnawy, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/692,802

(22) Filed: Nov. 22, 2019

(65) Prior Publication Data

US 2020/0091429 A1 Mar. 19, 2020

Related U.S. Application Data

(63) Continuation-in-part of application No. 16/574,471, filed on Sep. 18, 2019, and a continuation-in-part of application No. 16/557,577, filed on Aug. 30, 2019, and a continuation-in-part of application No. 16/546,211, filed on Aug. 20, 2019, and a continuation-in-part of application No. 16/185,620, (Continued)

(51) Int. Cl.
H01L 45/00 (2006.01)

(52) U.S. Cl.
CPC .......... *H01L 45/1608* (2013.01); *H01L 45/06* (2013.01); *H01L 45/1286* (2013.01); *H01L 45/143* (2013.01); *H01L 45/144* (2013.01); *H01L 45/1675* (2013.01)

(58) Field of Classification Search
None
See application file for complete search history.

(56) References Cited

U.S. PATENT DOCUMENTS

| 7,522,029 B1 | 4/2009 | Lantz |
|---|---|---|
| 8,314,983 B2 | 11/2012 | Frank |

(Continued)

FOREIGN PATENT DOCUMENTS

WO   WO 2016/028362   2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

(Continued)

*Primary Examiner* — Evren Seven
(74) *Attorney, Agent, or Firm* — Farjami & Farjami LLP

(57) ABSTRACT

A semiconductor structure includes a semiconductor mesa situated on a semiconductor substrate, a trap-rich region comprising polycrystalline silicon adjacent to the semiconductor mesa, and a phase-change material (PCM) radio frequency (RF) switch. A heating element of the PCM RF switch is situated over the semiconductor mesa. An interconnect segment coupled to the PCM RF switch is situated over the trap-rich region. Alternatively, a semiconductor structure can include a trap-rich region adjacent to a single crystal region of the semiconductor substrate, where the trap-rich region is formed by implant damaging, and where the heating element of the PCM RF switch is situated over the single crystal region.

20 Claims, 15 Drawing Sheets

Related U.S. Application Data filed on Nov. 9, 2018, now Pat. No. 10,615,338, and a continuation-in-part of application No. 16/114,106, filed on Aug. 27, 2018, said application No. 16/546,211 is a continuation of application No. 16/103,587, filed on Aug. 14, 2018, now Pat. No. 10,461,253, said application No. 16/557,577 is a continuation of application No. 16/103,646, filed on Aug. 14, 2018, now Pat. No. 10,475,993, said application No. 16/574,471 is a continuation of application No. 16/103,490, filed on Aug. 14, 2018, now Pat. No. 10,476,001.

(56) References Cited

U.S. PATENT DOCUMENTS

| | | |
|---|---|---|
| 2,014,181 A1 | 7/2014 | Moon |
| 9,257,647 B2 | 2/2016 | Borodulin |
| 9,362,492 B2 | 6/2016 | Goktepeli |
| 9,368,720 B1 | 6/2016 | Moon |
| 9,444,430 B1 | 9/2016 | Abdo |
| 9,601,545 B1 | 3/2017 | Tu |
| 9,640,759 B1 | 5/2017 | Curioni |
| 9,891,112 B1 | 2/2018 | Abel |
| 9,917,104 B1 | 3/2018 | Roizin |
| 10,128,243 B2 | 11/2018 | Yoo |
| 10,164,608 B2 | 12/2018 | Belot |
| 10,529,922 B1 | 1/2020 | Howard |
| 2005/0127348 A1 | 6/2005 | Horak |
| 2006/0246712 A1 | 11/2006 | Kim |
| 2007/0075347 A1 | 4/2007 | Lai |
| 2008/0142775 A1 | 6/2008 | Chen |
| 2010/0084626 A1 | 4/2010 | Delhougne |
| 2010/0238720 A1 | 9/2010 | Tio Castro |
| 2011/0291784 A1 | 12/2011 | Nakatsuji |
| 2013/0187120 A1 | 7/2013 | Redaelli |
| 2013/0285000 A1 | 10/2013 | Arai |
| 2014/0191181 A1 | 7/2014 | Moon |
| 2014/0264230 A1 | 9/2014 | Borodulin |
| 2014/0339610 A1 | 11/2014 | Rashed |
| 2015/0048424 A1 | 2/2015 | Tien |
| 2015/0090949 A1 | 4/2015 | Chang |
| 2015/0333131 A1 | 11/2015 | Mojumder |
| 2016/0035973 A1 | 2/2016 | Raieszadeh |
| 2016/0056373 A1 | 2/2016 | Goktepeli |
| 2016/0308507 A1 | 10/2016 | Engelen |
| 2017/0092694 A1 | 3/2017 | BrightSky |
| 2017/0126205 A1 | 5/2017 | Lin |
| 2017/0187347 A1 | 6/2017 | Rinaldi |
| 2017/0243861 A1 | 8/2017 | Wang |
| 2017/0365427 A1 | 12/2017 | Borodulin |
| 2018/0005786 A1 | 1/2018 | Navarro |
| 2018/0138894 A1 | 5/2018 | Belot |
| 2018/0194615 A1 | 7/2018 | Nawaz |
| 2018/0269393 A1 | 9/2018 | Zhang |
| 2019/0064555 A1 | 2/2019 | Hosseini |
| 2019/0067572 A1 | 2/2019 | Tsai |
| 2019/0088721 A1 | 3/2019 | Reig |
| 2019/0172657 A1 | 6/2019 | Zhu |
| 2019/0267214 A1 | 8/2019 | Liu |
| 2019/0296718 A1 | 9/2019 | Birkbeck |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

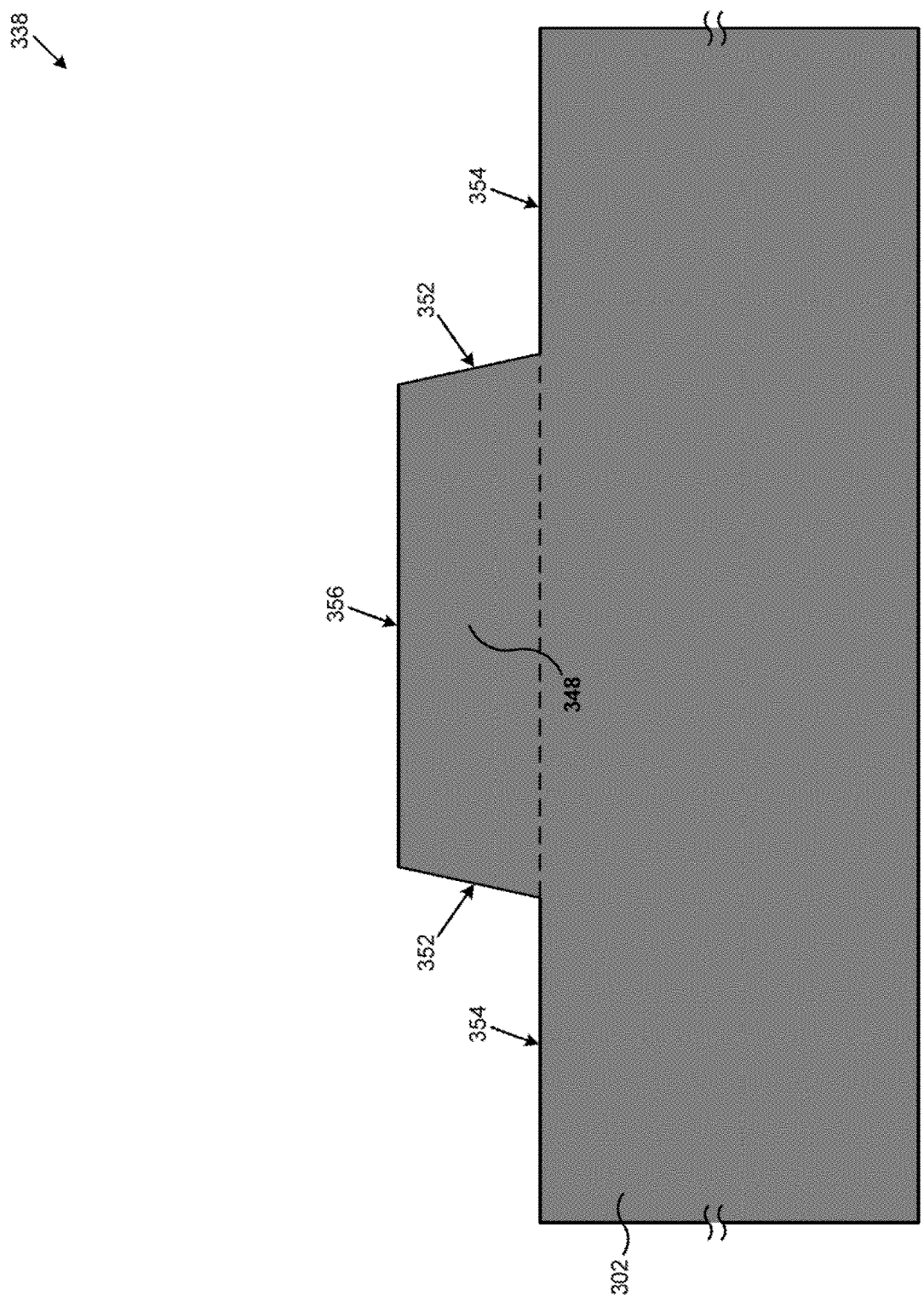

HIGH RELIABILITY PHASE-CHANGE MATERIAL (PCM) RADIO FREQUENCY (RF) SWITCH USING TRAP-RICH REGION

CLAIMS OF PRIORITY

The present application is a continuation-in-part of and claims the benefit of and priority to application Ser. No. 16/574,471 filed on Sep. 18, 2019, titled "Phase-Change Material RF Switch,"which is in turn a continuation of and claims the benefit of and priority to application Ser. No. 16/103,490 filed on Aug. 14, 2018, titled "Manufacturing RF Switch Based on Phase-Change Material."The present application is also a continuation-in-part of and claims the benefit of and priority to application Ser. No. 16/546,211 filed on Aug. 20, 2019, titled "High Reliability RF Switch Based on Phase-Change Material,"which is in turn a continuation of and claims the benefit of and priority to application Ser. No. 16/103,587 filed on Aug. 14, 2018, titled "Design for High Reliability RF Switch Based on Phase-Change Material."The present application is also a continuation-in-part of and claims the benefit of and priority to application Ser. No. 16/557,577 filed on Aug. 30, 2019, titled "Method of Manufacturing PCM RF Switch,"which is in turn a continuation of and claims the benefit of and priority to application Ser. No. 16/103,646 filed on Aug. 14, 2018, titled "PCM RF Switch Fabrication with Subtractively Formed Heater."The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element."Furthermore, the present application is a continuation-in-part of and claims the benefit of and priority to application Ser. No. 16/185,620 filed on Nov. 9, 2018, titled "Phase-Change Material (PCM) Contacts with Slot Lower Portions and Contact Dielectric for Reducing Parasitic Capacitance and Improving Manufacturability in PCM RF Switches."The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

In order to rapidly cool down phase-change materials, heat must be dissipated from PCM RF switches by using heat spreading techniques. However, heat spreaders may pose manufacturing cost and device design challenges. Further, heat spreaders may result in increased harmonic coupling experienced by integrated devices. Techniques for reducing harmonic coupling applicable to conventional semiconductor devices may not be suitable for PCM RF switches, since such techniques may significantly impact thermal energy management and heat dissipation capability of PCM RF switches and may significantly reduce the reliability of PCM RF switches.

SUMMARY

The present disclosure is directed to a high reliability phase-change material (PCM) radio frequency (RF) switch using a trap-rich region, substantially as shown in and/or described in connection with at least one of the figures, and as set forth in the claims.

BRIEF DESCRIPTION OF THE DRAWINGS

FIG. 3E illustrates a cross-sectional view of a portion of a semiconductor structure processed in accordance with the flowchart of FIG. 2 according to one implementation of the present application.

DETAILED DESCRIPTION

Figure 1:
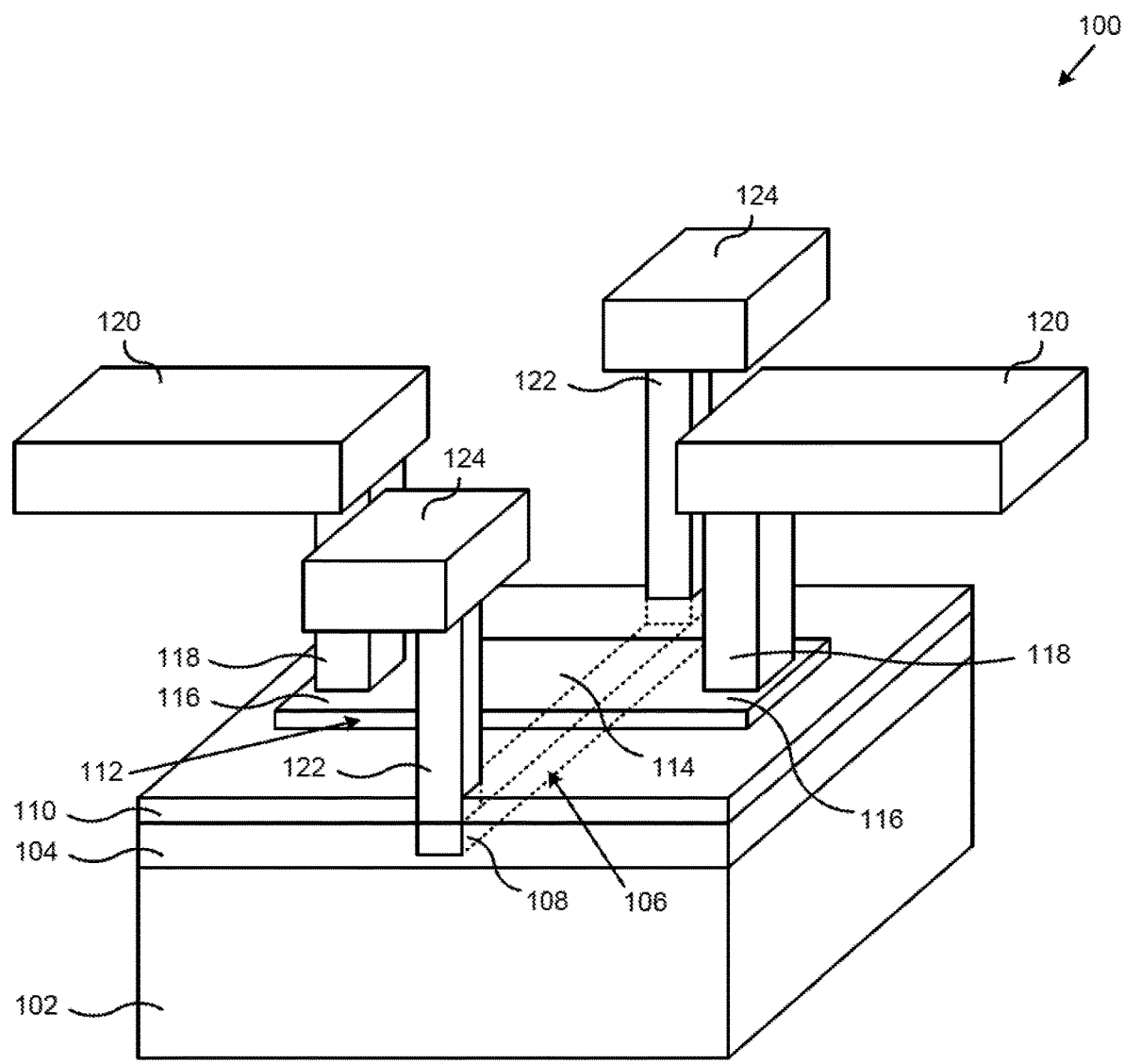
FIG. 1 illustrates a perspective view of a portion of a semiconductor structure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a perspective view of a portion of semiconductor structure. As shown in FIG. 1, semiconductor structure 100 includes substrate 102, lower dielectric 104, heating element 106 having terminal segments 108, thermally conductive and electrically insulating layer 110, phase-change material (PCM) 112 having active segment 114 and passive segments 116, PCM contacts 118, PCM interconnect segments 120, heater contacts 122, and heater interconnect segments 124. As used herein, heating element 106, thermally conductive and electrically insulating layer 110, PCM 112, PCM contacts 118, and heater contacts 122 may be collectively referred to as a PCM radio frequency (RF) switch. For purposes of illustration, the perspective view in FIG. 1 shows selected portions of semiconductor structure 100. Semiconductor structure 100 may include other structures not shown FIG. 1.

Substrate 102 is situated under lower dielectric 104. In various implementations, substrate 102 is a silicon (Si), silicon-on-insulator (SOI), sapphire, complementary metal-oxide-semiconductor (CMOS), bipolar CMOS (BiCMOS), or group substrate. In one implementation, substrate 102 is an insulator, such as silicon dioxide ($SiO_2$). In various implementations, substrate 102 includes a heat spreader or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in semiconductor structure 100 is situated above substrate 102 and below thermally conductive and electrically insulating layer 110. As shown in FIG. 1, lower dielectric 104 is also adjacent to sides of heating element 106. Lower dielectric 104 extends along the width of semiconductor structure 100, and is also coplanar with the top of heating element 106. Because semiconductor structure 100 includes lower dielectric 104 on the sides of heating element 106, less heat transfers horizontally (i.e., from the sides) and more heat dissipates vertically, from heating element 106 toward active segment 114 of PCM 112. In various implementations, lower dielectric 104 can have a relative width and/or a relative thickness greater or less than shown in FIG. 1. Lower dielectric 104 can comprise any material with thermal conductivity less than that of thermally conductive and electrically insulating layer 110. In one implementation, lower dielectric 104 comprises $SiO_2$.

Heating element 106 in semiconductor structure 100 is situated in lower dielectric 104. Heating element 106 also approximately defines active segment 114 of PCM 112. Heating element 106 generates a crystallizing heat pulse or an amorphizing heat pulse for transforming active segment 114 of PCM 112. Heating element 106 can comprise any material capable of Joule heating. Heating element 106 can be connected to electrodes of a pulser (not shown in FIG. 1) that generates voltage or current pulses. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 106 comprises tungsten lined with titanium and titanium nitride.

Thermally conductive and electrically insulating layer 110 in semiconductor structure 100 is situated on top of heating element 106 and lower dielectric 104, and under PCM 112 and, in particular, under active segment 114 of PCM 112. Thermally conductive and electrically insulating layer 110 ensures efficient heat transfer from heating element 106 toward active segment 114 of PCM 112, while electrically insulating heating element 106 from PCM contacts 118, PCM 112, and other neighboring structures.

Thermally conductive and electrically insulating layer 110 can comprise any material with high thermal conductivity and high electrical resistivity. In various implementations, thermally conductive and electrically insulating layer 110 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating layer 110 can be a segment that does not extend along the width of semiconductor structure 100. For example, thermally conductive and electrically insulating layer 110 can be a segment approximately aligned with heating element 106.

PCM 112 in semiconductor structure 100 is situated on top of thermally conductive and electrically insulating layer 110. The PCM RF switch utilizes PCM 112 to transfer input RF signals in an ON state and to block input RF signals in an OFF state. PCM 112 includes active segment 114 and passive segments 116. Active segment 114 of PCM 112 is approximately defined by heating element 106. Passive segments 116 of PCM 112 extend outward and are transverse to heating element 106, and are situated approximately under PCM contacts 118. As used herein, "active segment" refers to a segment of PCM that transforms between crystalline and amorphous phases (i.e., transforms between conductive and resistive states), for example, in response to a crystallizing or an amorphizing heat pulse generated by heating element 106, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing the PCM RF switch to switch between ON and OFF states respectively. Active segment 114 of PCM 112 must be heated and rapidly quenched in order for the PCM RF switch to switch states. If active segment 114 of PCM 112 does not quench rapidly enough, it will not transform, and the PCM RF switch will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 is transverse to PCM 112. Heating element 106 is illustrated with dashed lines as seen through various structures of semiconductor structure 100. Current flowing in heating element 106 flows approximately under active segment 114 of PCM 112.

PCM contacts 118 in semiconductor structure 100 are connected to passive segments 116 of PCM 112. Similarly, heater contacts 122 are connected to terminal segments 108 of heating element 106. PCM contacts 118 provide RF signals to and from PCM 112. Heater contacts 122 provide power to heating element 106 for generating a crystallizing heat pulse or an amorphizing heat pulse. In various implementations, PCM contacts 118 and heater contacts 122 can comprise tungsten (W), copper (Cu), or aluminum (Al). PCM contacts 118 and heater contacts 122 can extend through various dielectric layers (not shown in FIG. 1). In one implementation, in order to ensure uniform contact between PCM 112 and PCM contacts 118, PCM contacts 118 can extend through a contact uniformity support layer (not shown in FIG. 1) situated on top of PCM 112, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

PCM interconnect segments 120 in semiconductor structure are connected to PCM contacts 118. Similarly, heater interconnect segments 124 are connected to heater contacts 122. PCM interconnect segments 120 route RF signals from/to an external connection to/from PCM 112 through PCM contacts 118. Similarly, heater interconnect segments 124 route electrical pulses from an external connection to heating element 106 through heater contacts 122. Additional interconnect segments and/or vias (not shown in FIG. 1) can be connected to PCM interconnect segments 120 and heater interconnect segments 124. In various implementations, PCM interconnect segments 120 and heater interconnect segments 124 can comprise W, Cu, and/or Al. In the present implementation, PCM interconnect segments 120 and heater interconnect segments 124 are situated at the same interlayer metal level. In various implementations, PCM interconnect segments 120 and heater interconnect segments 124 can be situated at different interlayer metal levels. The dimensions of PCM interconnect segments 120 and heater interconnect segments 124 can be significantly larger than the dimensions of PCM contacts 118 and heater contacts 122, in order to more easily establish external connections and to improve signal handling.

Although semiconductor structure 100 can more easily establish external connection and improve signal handling, parasitic capacitors having undesirably high capacitance values can be formed between PCM interconnect segments 120 and electrically conductive material in substrate 102. Parasitic capacitors significantly degrade the frequency response of the PCM RF switch in both the ON and OFF states. Further, charge carriers can create parasitic surface conduction at the interface of substrate 102 and lower dielectric 104, resulting in increased harmonic coupling which can propagate across semiconductor structure 100 and increase harmonic coupling experienced by integrated devices not shown in FIG. 1). Moreover, as described above, active segment 114 of PCM 112 must quench rapidly in order for the PCM RF switch to successfully switch states. Thus, semiconductor structure 100 needs to balance both thermal and RF performance. According to the present application, the PCM RF switch can be utilized in a semiconductor structure that reduces harmonic coupling while also providing effective heat dissipation.

Figure 2:
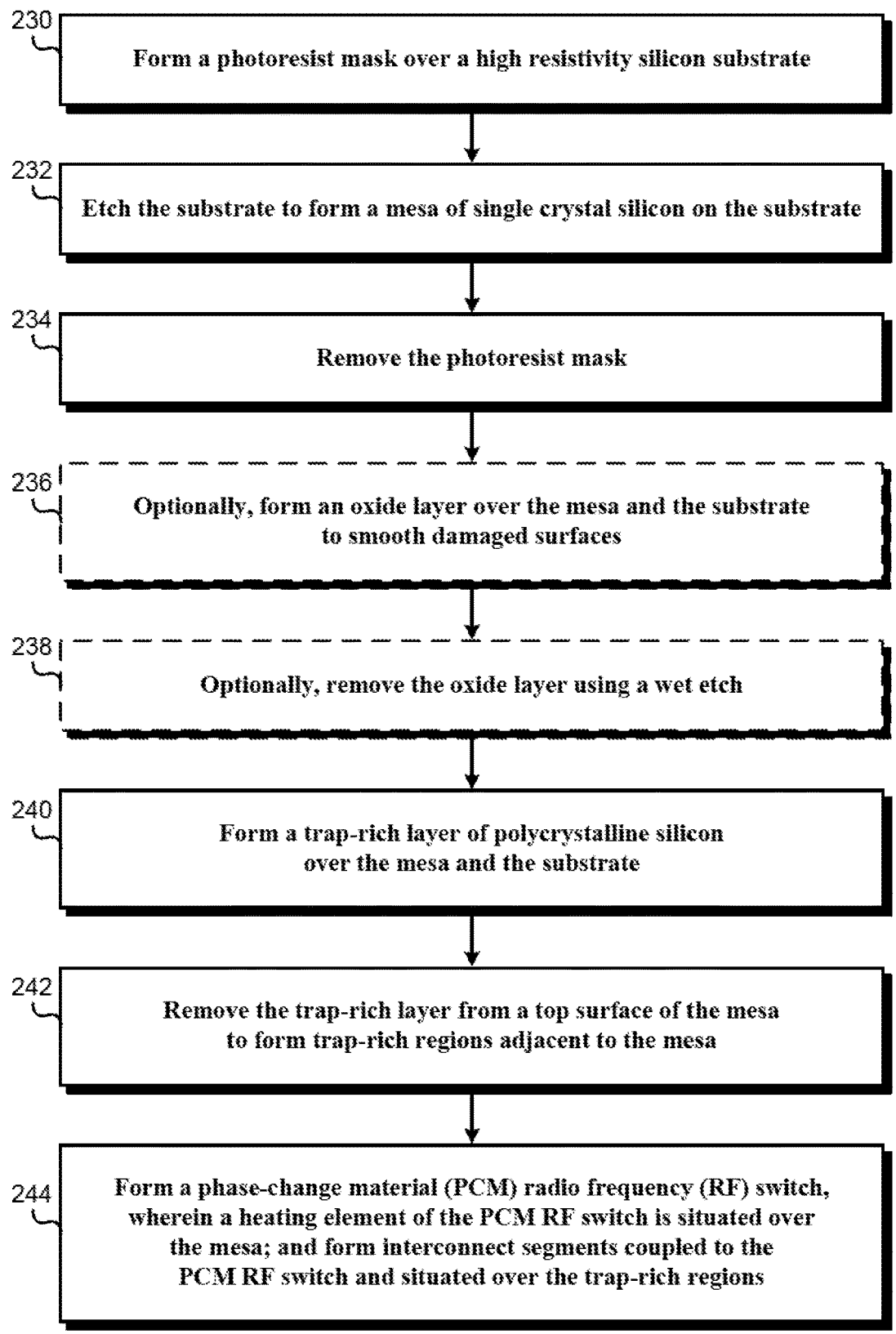
FIG. 2 illustrates a portion of a flowchart of an exemplary method for manufacturing a semiconductor structure according to one implementation of the present application.
Figure 3A:
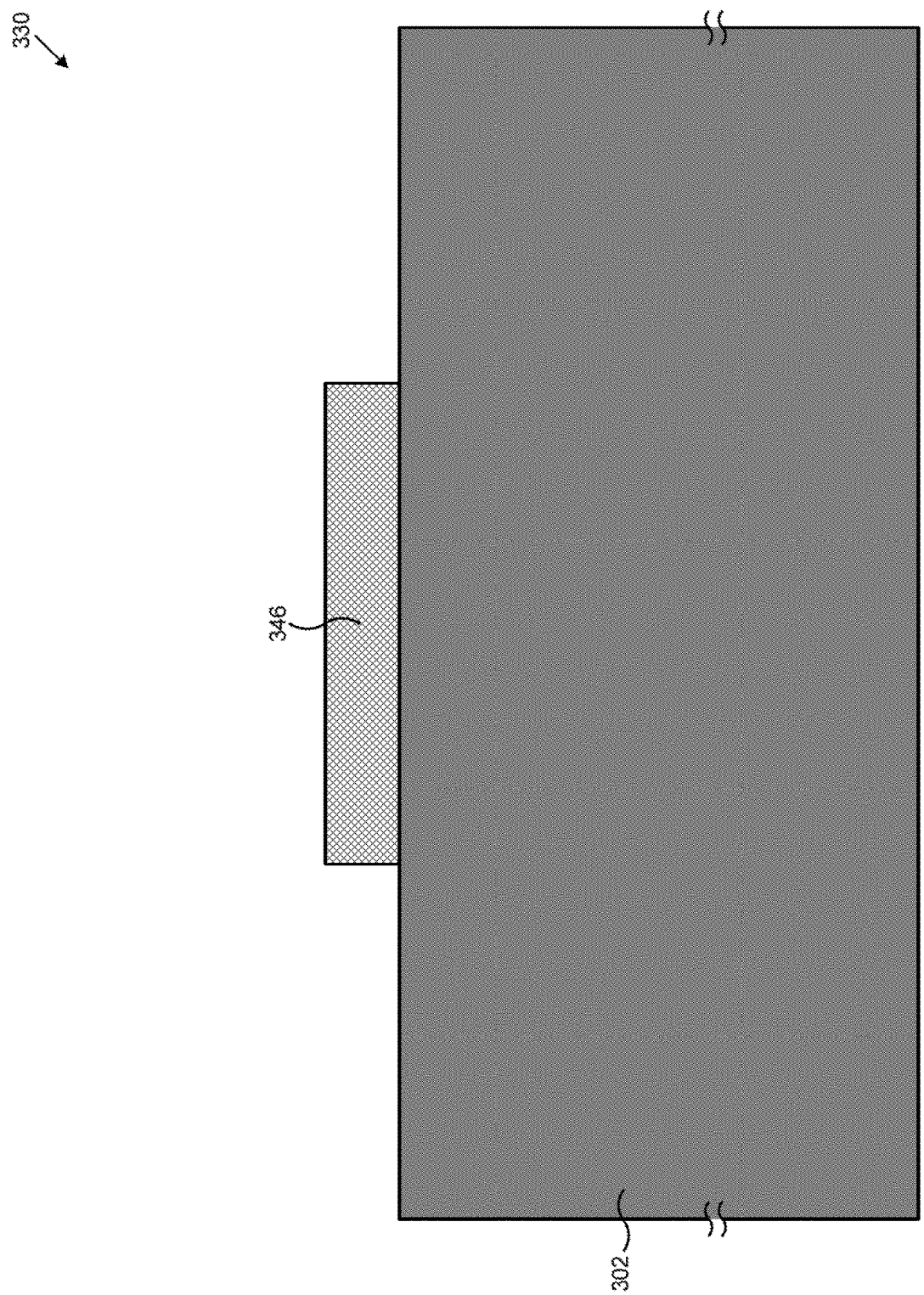
FIG. 3A illustrates a cross-sectional view of a portion of a semiconductor structure processed in accordance with the flowchart of FIG. 2 according to one implementation of the present application.
Figure 3B:
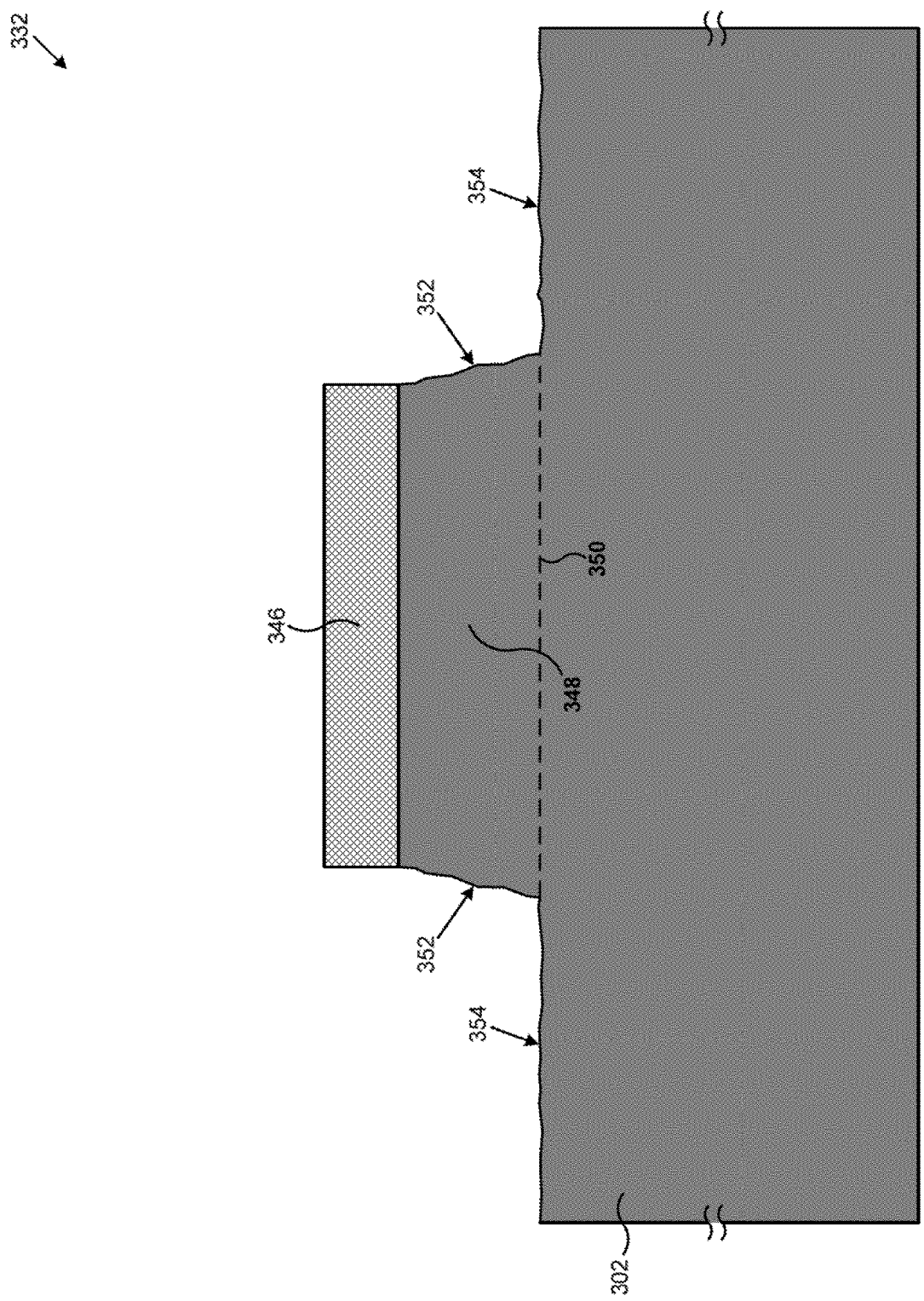
FIG. 3B illustrates a cross-sectional view of a portion of a semiconductor structure processed in accordance with the flowchart of FIG. 2 according to one implementation of the present application.

FIG. 2 illustrates a portion of a flowchart of an exemplary method for manufacturing a semiconductor structure according to one implementation of the present application. Structures shown in FIGS. 3A through 3H illustrate the results of performing actions 230 through 244 shown in the flowchart of FIG. 2. For example, FIG. 3A shows a semiconductor structure after performing action 230 in FIG. 2, FIG. 3B shows a semiconductor structure after performing action 232 in FIG. 2, and so forth.

Actions 230 through 244 shown in the flowchart of FIG. 2 are sufficient to describe one implementation of the present. inventive concepts. Other implementations of the present inventive concepts may utilize actions different from those shown in the flowchart of FIG. 2. Certain details and features have been left out of the flowchart of FIG. 2 that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 3A illustrates a cross-sectional view of a portion of a semiconductor structure processed in accordance with action 230 in the flowchart of FIG. 2 according to one implementation of the present application. As shown in FIG. 3A, in semiconductor structure 330, photoresist mask 346 is formed over high resistivity silicon substrate 302.

High resistivity silicon substrate 302 is a bulk single crystal silicon substrate having high resistivity. In various implementations, high resistivity silicon substrate 302 can be a Czochralski, float-zone, or epitaxial silicon substrate. In various implementations, the electrical resistivity of high resistivity silicon substrate 302 can range from approximately five hundred ohm-centimeters to approximately ten thousand ohm-centimeters (500Ω.cm-10,000Ω.cm). In various implementations, high resistivity silicon substrate 302 can have a thickness of approximately seven hundred microns (700 μm) or greater or less. In various implementations, high resistivity silicon substrate 302 may be any other type of high resistivity substrate. For example, high resistivity silicon substrate 302 can comprise germanium (Ge), silicon germanium ($Si_XGe_Y$), or silicon carbide ($Si_XC_Y$). In one implementation, the thermal conductivity of high resistivity silicon substrate 302 can range from approximately one hundred fifty watts per meter-kelvin to approximately three hundred seventy watts per meter-kelvin (100 W/(m.K)-150 W/(m.K)).

Photoresist mask 346 formed over high resistivity silicon substrate 302 can be any mask known in the art. Photoresist mask 346 protects high resistivity silicon substrate 302 during a subsequent etching action. In the present implementation, photoresist mask 346 is approximately centered over high resistivity silicon substrate 302. In various implementations, photoresist mask 346 can have any other pattern and/or alignment. In one implementation, a hardmask, for example, comprising silicon nitride ($Si_xN_y$), can be used instead of photoresist mask 346.

FIG. 3B illustrates a cross-sectional view of a portion of a semiconductor structure processed in accordance with action 232 in the flowchart of FIG. 2 according to one implementation of the present application. As shown in FIG. 3B, in semiconductor structure 332, high resistivity silicon substrate 302 has been etched to form mesa 348 of single crystal silicon on high resistivity silicon substrate 302.

In one implementation, etching high resistivity silicon substrate 302 in action 232 uses a fluorine-based reactive ion etch (RIE). In various implementations, etching high resistivity silicon substrate 302 can use any plasma dry etch known in the art such as a chlorine based etch or sulfur hexafluoride ($SF_6$). The etching action can be timed to stop based on a predetermined etch rate. In various implementations, the depth of the etch can range from approximately one micron to approximately five microns (1 μm -5 μm).

Photoresist mask 346 protects high resistivity silicon substrate 302 during the etching action. Thus, mesa 348 of single crystal silicon is formed below photoresist mask 346 on high resistivity silicon substrate 302. In FIG. 3B, line 350 illustrates a boundary of mesa 348. It is understood that line 350 merely illustrates a conceptual boundary of mesa 348, and that mesa 348 and high resistivity silicon substrate 302 can be one continuous material. The height of mesa 348 of single crystal silicon corresponds to the depth of the etching action. In various implementations, the height of mesa 348 of single crystal silicon can range from approximately one micron to approximately five microns (1 μm-5 μm). In the present implementation, side surfaces 352 of mesa 348 are slightly angled as a result of the etching action. In various implementations, side surfaces 352 of mesa 348 may have steeper or shallower angles. Notably, side surfaces 352 of mesa 348 of single crystal silicon and top surfaces 354 of high resistivity silicon substrate 302 can be damaged as a result of the etching action, as indicated by the jagged side surfaces 352 and the jagged top surfaces 354 in FIG. 3B.

Figure 3C:
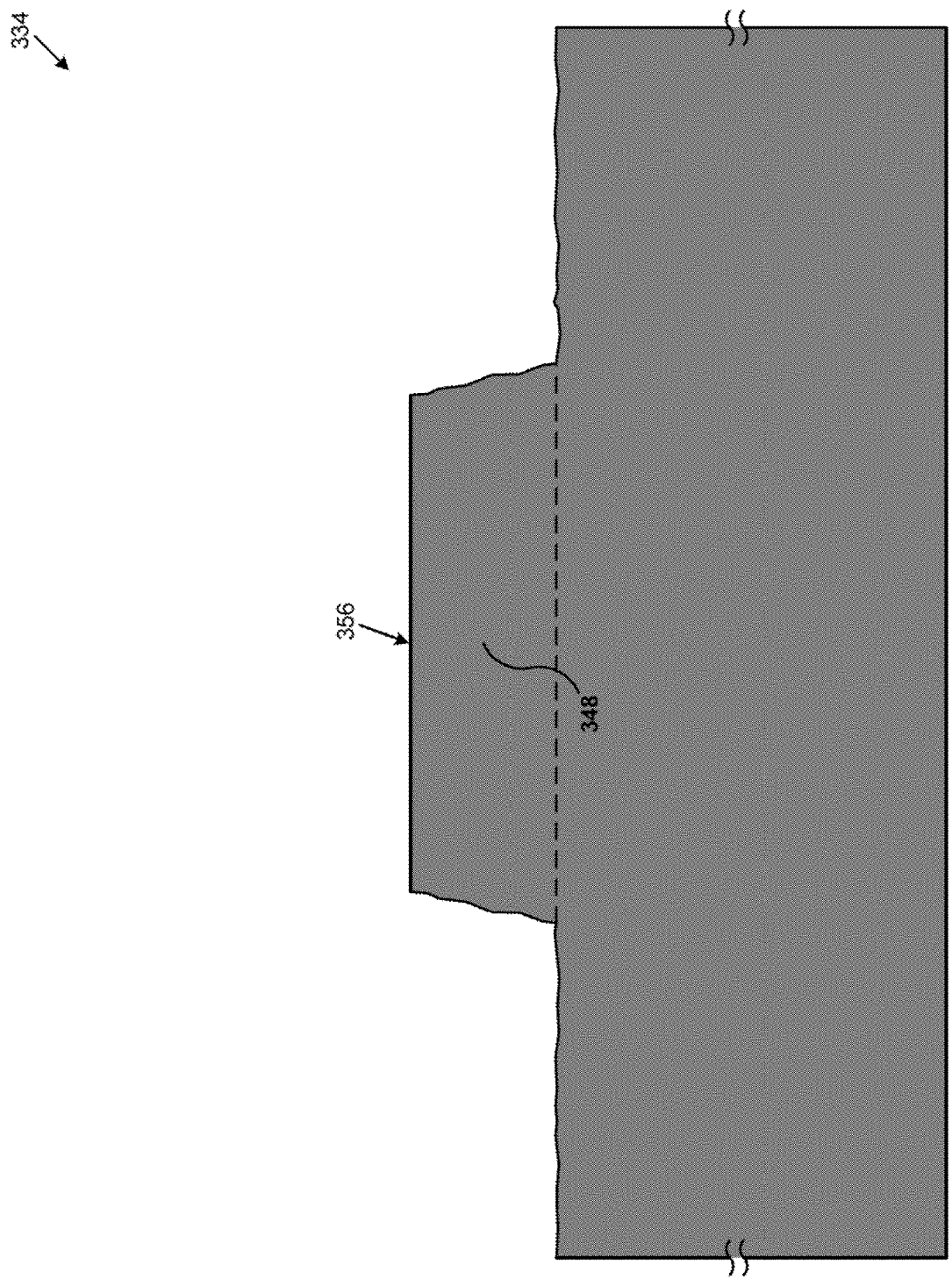
FIG. 3C illustrates a cross-sectional view of a portion of a semiconductor structure processed in accordance with the flowchart of FIG. 2 according to one implementation of the present application.

FIG. 3C illustrates a cross-sectional view of a portion of a semiconductor structure processed in accordance with action 234 in the flowchart of FIG. 2 according to one implementation of the present application. As shown in FIG. 3C, in semiconductor structure 334, photoresist mask 346 (shown in FIG. 3B) is removed, exposing top surface 356 of mesa 348 of single crystal silicon. Photoresist mask 346 can be removed using any means known in the art, such as wet etching with an organic solvent, or plasma dry etching.

Figure 3D:
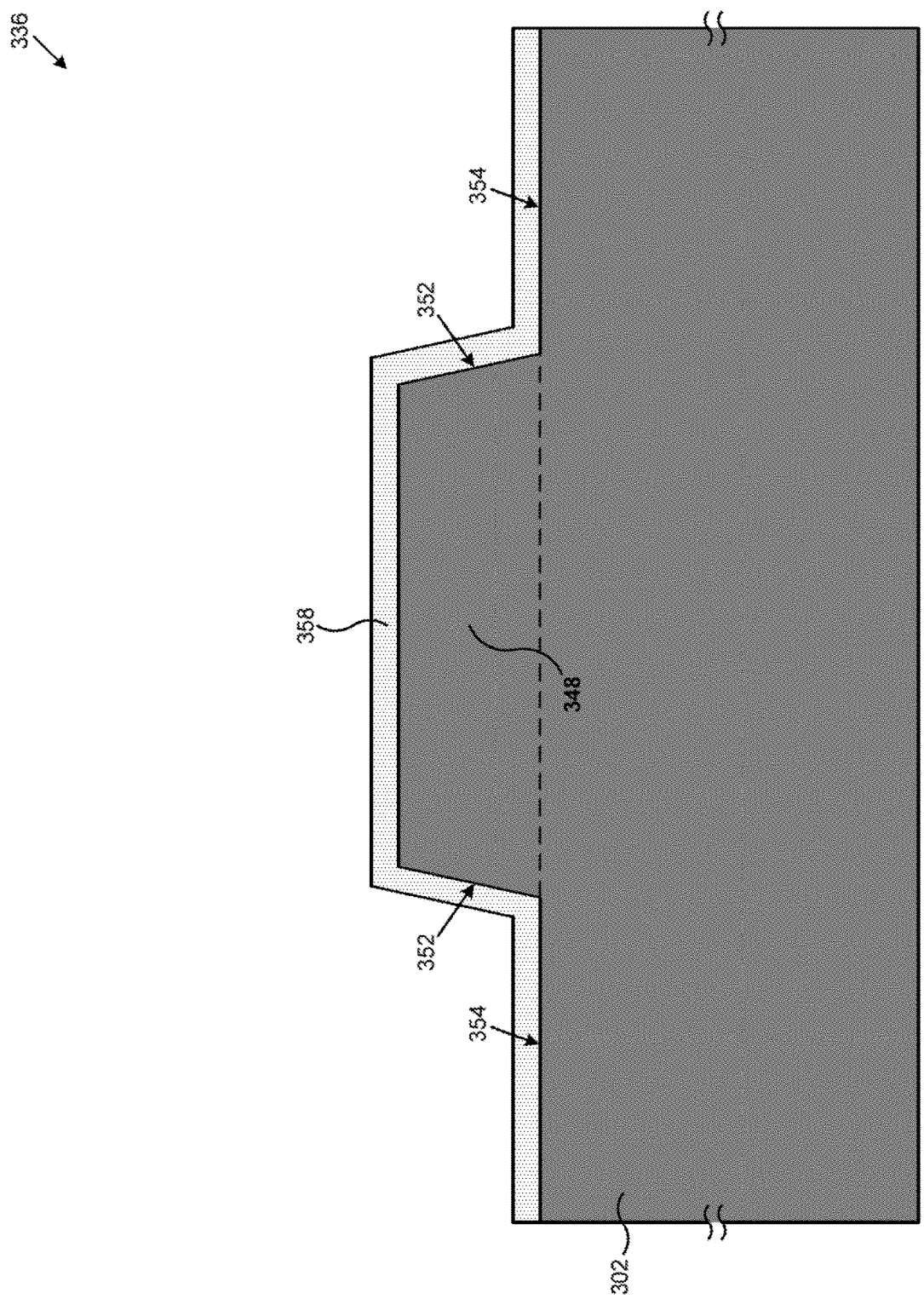
FIG. 3D illustrates a cross-sectional view of a portion of a semiconductor structure processed in accordance with the flowchart of FIG. 2 according to one implementation of the present application.

FIG. 3D illustrates a cross-sectional view of a portion of a semiconductor structure processed in accordance with optional action 236 in the flowchart of FIG. 2 according to one implementation of the present application. As shown in FIG. 3D, in semiconductor structure 336, optional oxide layer 358 is formed over mesa 348 of single crystal silicon and high resistivity silicon substrate 302.

Optional oxide layer 358 is a thermally gown oxide, such as thermal $SiO_2$. As shown in FIG. 3D, forming optional oxide layer 358 smooths side surfaces 352 of mesa 348 of single crystal silicon and top surfaces 354 of high resistivity silicon substrate 302 that were damaged in a previous etching action. Smoothing side surfaces 352 and top surfaces 354 reduces nonconformities when forming a trap-rich layer in a subsequent action. Optional oxide layer 358 is considered optional in that semiconductor structures according to the present application can be formed without optional oxide layer 358.

FIG. 3E illustrates a cross-sectional view of a portion of a semiconductor structure processed in accordance with optional action 238 in the flowchart of FIG. 2 according to one implementation of the present application. As shown in FIG. 3E, in semiconductor structure 338, optional oxide layer 358 (shown in. FIG. 3D) is removed, exposing top surface 356 and side surfaces 352 of mesa 348 of single crystal silicon and top surfaces 354 of high resistivity silicon substrate 302. Optional oxide layer 358 can be removed using any means known in the art, such as wet etching. Removing optional oxide layer 358 is considered optional in that, if optional oxide layer 358 is not used, it does not need to be removed.

Figure 3F:
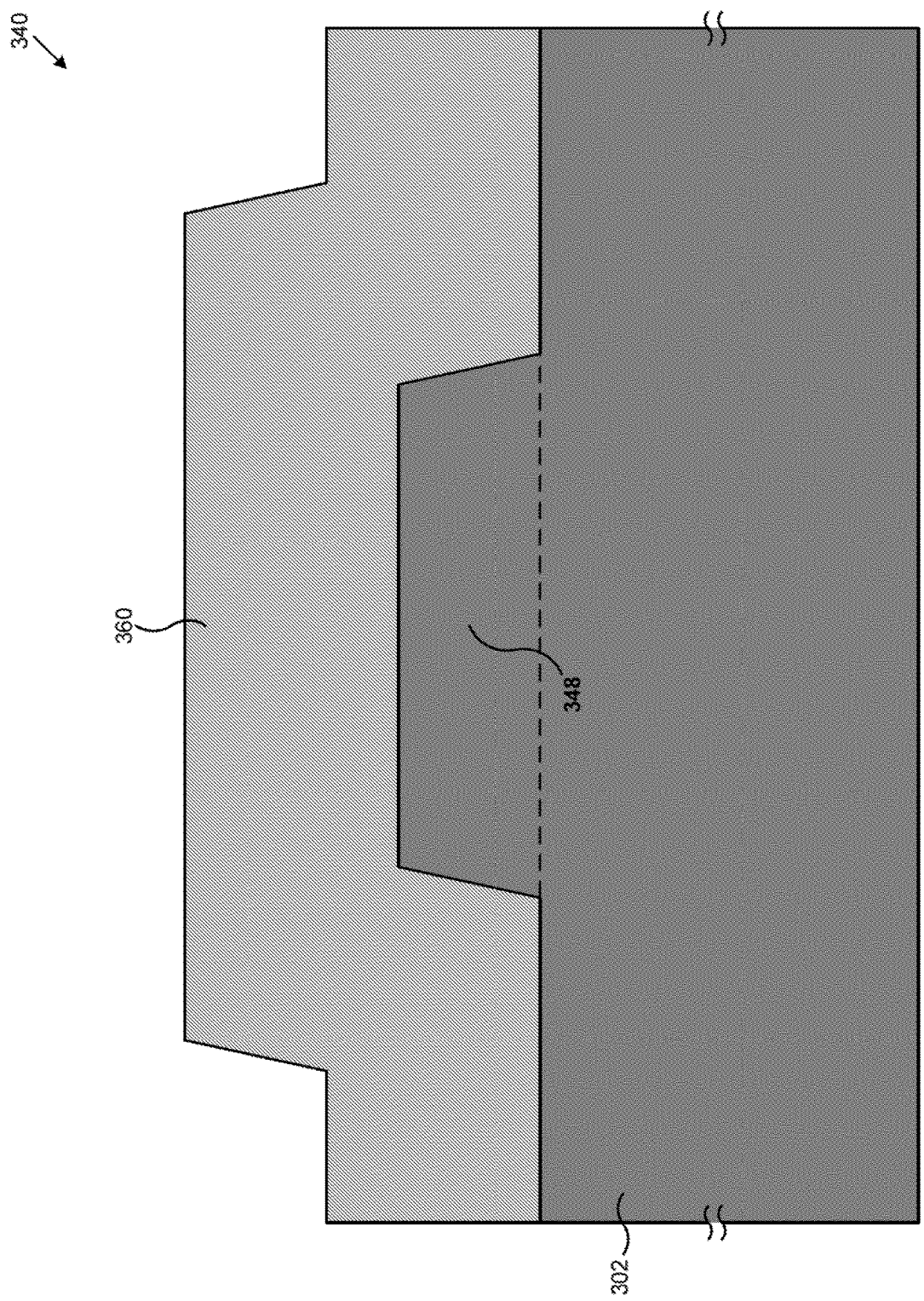
FIG. 3F illustrates a cross-sectional view of a portion of a semiconductor structure processed in accordance with the flowchart of FIG. 2 according to one implementation of the present application.

FIG. 3F illustrates a cross-sectional view of a portion of a semiconductor structure processed in accordance with action 240 in the flowchart of FIG. 2 according to one implementation of the present application. As shown in FIG. 3F, in semiconductor structure 340, trap-rich layer 360 is formed over mesa 348 of single crystal silicon and high resistivity silicon substrate 302.

Trap-rich layer 360 can comprise, for example, polycrystalline silicon (poly-Si). Trap-rich layer 360 of poly-Si has a high density of electrical charge traps that decrease the mobility of free charge carriers. Trap-rich layer 360 of poly-Si can be formed using a low temperature chemical vapor deposition (CVD). Notably, because mesa 348 of single crystal silicon and high resistivity silicon substrate 302 are smooth, trap-rich layer 360 of poly-Si is formed with little or substantially no nonconformities. As shown in FIG. 3F, the thickness of trap-rich layer 360 of poly-Si is greater than the thickness of mesa 348 of single crystal silicon. For example, where the thickness of mesa 348 of single crystal silicon is approximately one micron (1 μm), the thickness of trap-rich layer 360 of poly-Si can range from approximately one micron to approximately two microns (1.0 μm-2.0 μm). In other implementations, the thickness of trap-rich layer 360 of poly-Si can be less than or approximately equal to the thickness of mesa 348 of single crystal silicon.

Figure 3G:
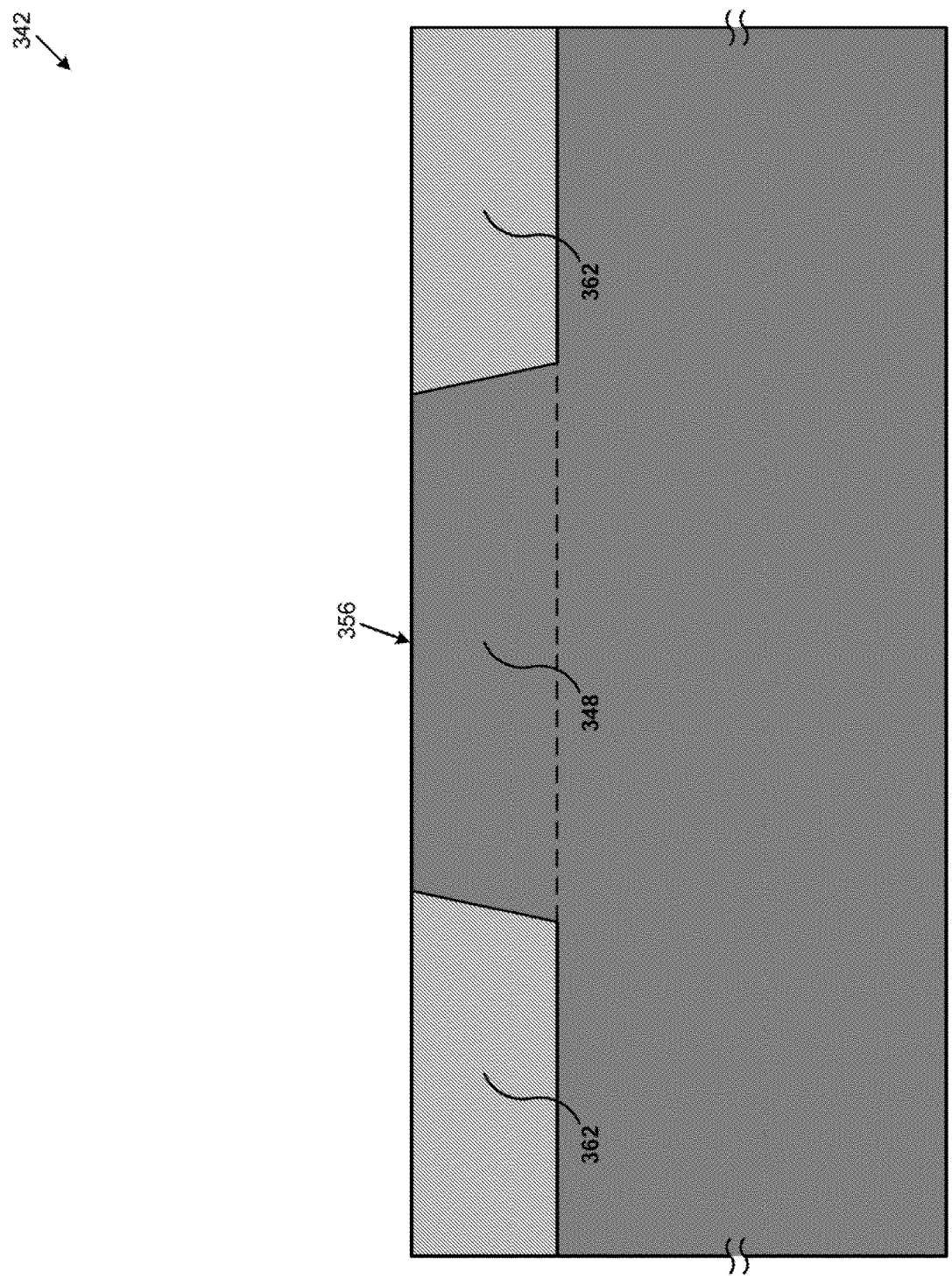
FIG. 3G illustrates a cross-sectional view of a portion of a semiconductor structure processed in accordance with the flowchart of FIG. 2 according to one implementation of the present application.

FIG. 3G illustrates a cross-sectional view of a portion of a semiconductor structure processed in accordance with optional action 242 in the flowchart of FIG. 2 according to one implementation of the present application. As shown in FIG. 3G, in semiconductor structure 342, trap-rich layer 360 of poly-Si (shown in FIG. 3F) is removed from top surface 356 of mesa 348 of single crystal silicon to form trap-rich regions 362 adjacent to mesa 348 of single crystal silicon.

In the present implementation, trap-rich regions 362 are substantially coplanar with mesa 348 of single crystal silicon. Trap-rich layer 360 of poly-Si (shown in FIG. 3F) can be removed from top surface 356 of mesa 348 of single crystal silicon using, for example, using chemical machine polishing (CMP). As described below, mesa 348 of single crystal silicon performs as a heat spreader. Coarse CMP of trap-rich layer 360 of poly-Si can cause undesirable damage to mesa 348 of single crystal silicon that can impair its performance as a heat spreader.

In one implementation, a CMP process is used on semiconductor structure 342 so that trap-rich regions 362 are substantially coplanar with mesa 348 of single crystal silicon. In various implementations, trap-rich regions 362 are not substantially coplanar with mesa 348 of single crystal silicon. However, semiconductor structure 342 improves formation of a PCM RF switch in a subsequent action as well as integration of other devices when trap-rich regions 362 are substantially coplanar with mesa 348 of single crystal silicon. Notably, although trap-rich regions 362 are illustrated as distinct regions in the cross-sectional view in FIG. 3H, in various implementations, trap-rich regions 362 can be integrally formed as a single trap-rich region, connected in a plane not illustrated in FIG. 3H.

Figure 3H:
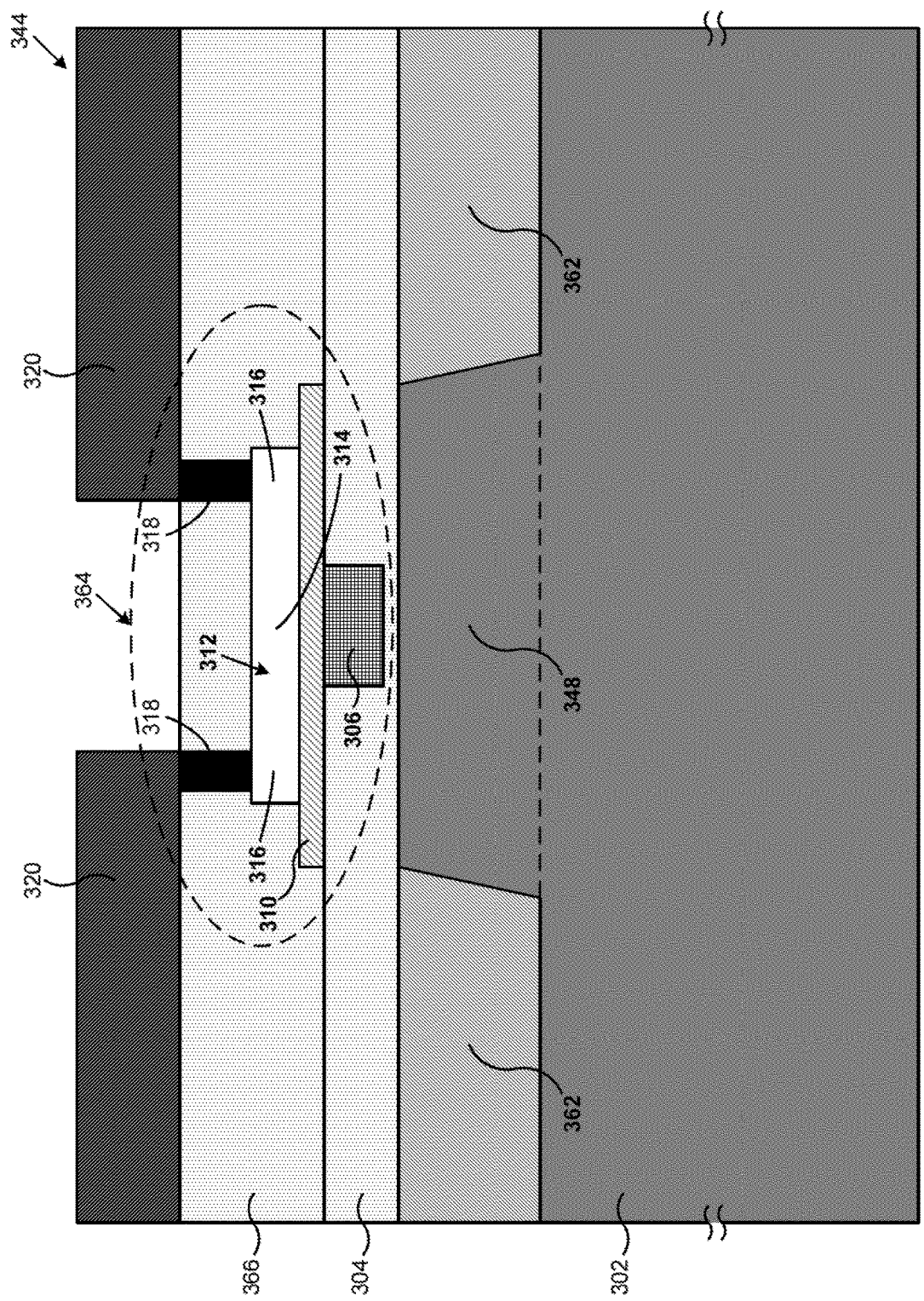
FIG. 3H illustrates a cross-sectional view of a portion of a semiconductor structure processed in accordance with the flowchart of FIG. 2 according to one implementation of the present application.

FIG. 3H illustrates a cross-sectional view of a portion of a semiconductor structure processed in accordance with action 244 in the flowchart of FIG. 2 according to one implementation of the present application. As shown in FIG. 3H, in semiconductor structure 344, PCM RF switch 364 and PCM interconnect segments 320 are formed. Semiconductor structure 344 includes high resistivity silicon substrate 302, mesa 348 of single crystal silicon, trap-rich regions 362, lower dielectric 304, PCM RF switch 364, interlayer dielectric 366, and PCM interconnect segments 320. PCM RF switch 364 includes heating element 306, thermally conductive and electrically insulating segment 310, PCM 312 having active segment 314 and passive segments 316, and PCM contacts 318. Semiconductor structure 344 in FIG. 3H is similar to semiconductor structure 100 in FIG. 1, and may have any implementations and advantages described above, except for differences described below.

As shown in FIG. 3H, heating element 306 of PCM RF switch 364 is situated over mesa 348 of single crystal silicon. In semiconductor structure 344, mesa 348 of single crystal silicon has high thermal conductivity and performs as a heat spreader for PCM RF switch 364. Mesa 348 of single crystal silicon dissipates excess heat generated by heating element 306 after a heat pulse, such as a crystallizing heat pulse or an amorphizing heat pulse, has transformed the state of PCM RF switch 364 to an ON state or an OFF state. In one implementation, the thermal conductivity of mesa 348 of single crystal silicon can range from approximately one hundred watts per meter-kelvin to approximately three hundred fifty watts per meter-kelvin (100 W/(m.K)-150 W/(m.K)).

In the present implementation, mesa 348 of single crystal silicon is substantially wider than heating element 306 to increase heat dissipation. In various implementations, mesa 348 of single crystal silicon can have a relative width greater or less than shown in FIG. 3H. In one implementation, in order for mesa 348 of single crystal silicon to effectively dissipate heat generated by heating element 306, the thickness of lower dielectric 304 beneath heating element 306 can be less than or approximately two thousand angstroms (2000 Å). In various implementations, lower dielectric 304 can comprise multiple layers, such as a layer beneath heating element 306 and another layer on sides of heating element 306.

In the present implementation, thermally conductive and electrically insulating segment 310 of PCM RF switch 364 is a segment substantially aligned with mesa 348, rather than a layer extending along the entire width of semiconductor structure 344. Thermally conductive and electrically insulating segment 310 simplifies formation of integrated devices (not shown in FIG. 3H) in interlayer dielectric 366. In various implementations, thermally conductive and electrically insulating segment 310 can have a relative width greater or less than shown in FIG. 3H.

PCM interconnect segments 320 are situated on interlayer dielectric 366. In one implementation, interlayer dielectric 366 comprises $SiO_2$. PCM interconnect segments 320 are also situated on and coupled to PCM contacts 318 of PCM RF switch 364. In one implementation, PCM interconnect segments 320 can have an offset relative to PCM contacts 318. In one implementation, PCM interconnect segments 320 can be integrally formed with PCM contacts 318. As described above, PCM interconnect segments 320 easily establish external connections and to improve signal handling. Additional interconnect segments and/or vias (not shown in FIG. 3H) can be connected to PCM interconnect segments 320. In one implementation, PCM interconnect segments 320 can be part of a step-wise structure of interconnect segments and vias.

As shown in FIG. 3H, portions of PCM interconnect segments 320 are situated over trap-rich regions 362. In semiconductor structure 344, trap-rich regions 362 have high trap density and increase the effective resistance of high resistivity silicon substrate 302. Trap-rich regions 362 also significantly reduce capacitance values of parasitic capacitors formed between PCM interconnect segments 320 and high resistivity silicon substrate 302. Further, trap-rich regions 362 significantly decrease the mobility of free charge carriers and harmonic coupling which can propagate across semiconductor structure 344.

If mesa 348 of single crystal silicon were not used, and instead a trap-rich layer extended along the width of semiconductor structure 344, semiconductor structure 344 would not effectively dissipate heat generated by heating element 306 of PCM RF switch 364. In particular, heat generally transfers faster in single crystal materials than in polycrystalline materials. For example, trap-rich regions 362 can be poly-Si, and have thermal conductivity of approximately thirty five watts per meter-kelvin (35 W/(m.K)). In contrast, for example, mesa 348 can be single crystal silicon, and its thermal conductivity can be approximately one hundred fifty watts per meter-kelvin (150 W/(m.K)).

Similarly, if trap-rich regions 362 were not used, semiconductor structure 344 would experience poor RF performance. For example, PCM interconnect segments 320 would create an increased parasitic capacitance with high resistivity silicon substrate 302. As another example, charge carriers would create parasitic surface conduction at the interface of high resistivity silicon substrate 302 and lower dielectric 304, resulting in an increased harmonic coupling which could propagate across semiconductor structure 344. Because semiconductor structure 344 utilizes trap-rich regions 362 adjacent to mesa 348 of single crystal silicon, semiconductor structure 344 significantly improves the frequency response of PCM RF switch 364 in both the ON and OFF states, and significantly reduces harmonic coupling experienced by integrated devices (not shown in FIG. 3H), while still effectively dissipating heat from heating element 306 and reliably transforming active segment 314 of PCM 312 during operation of PCM RF switch 364.

Figure 4:
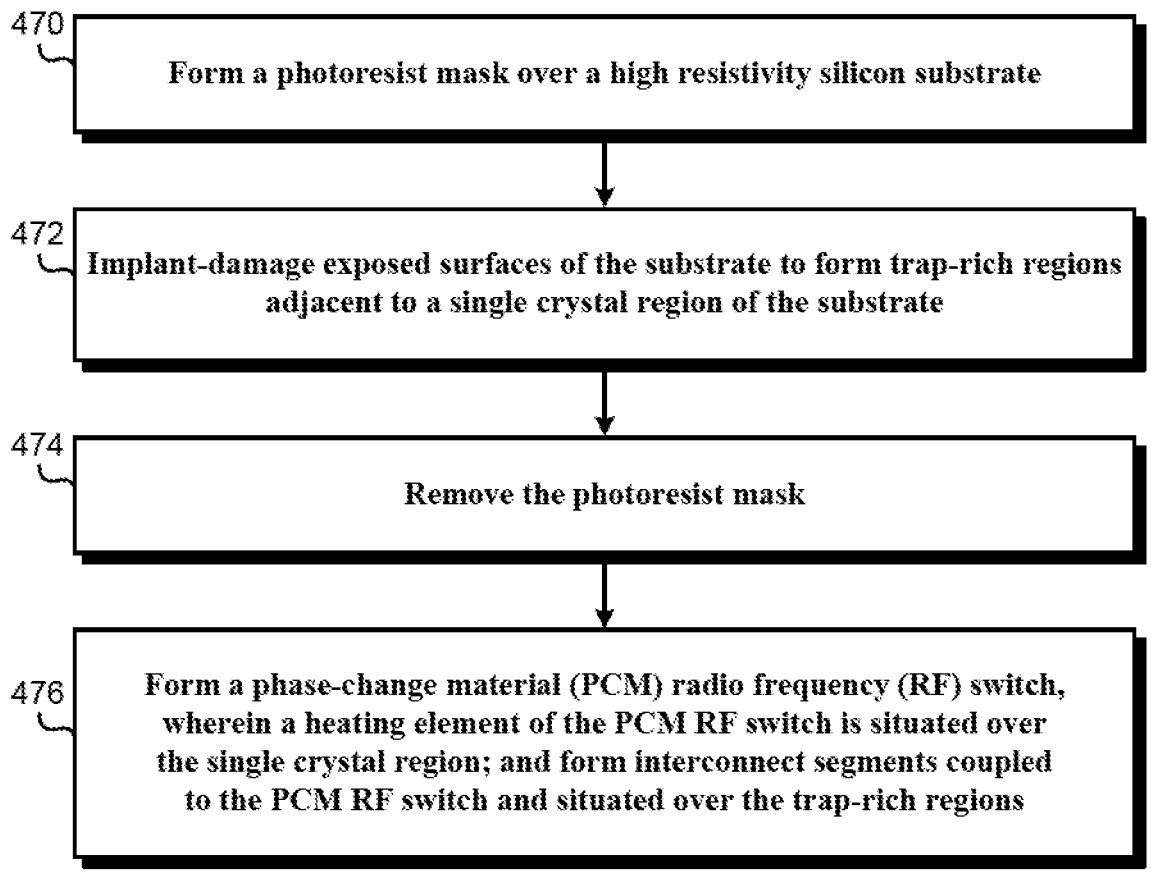
FIG. 4 illustrates a portion of a flowchart of an exemplary method for manufacturing a semiconductor structure according to one implementation of the present application.
Figure 5A:
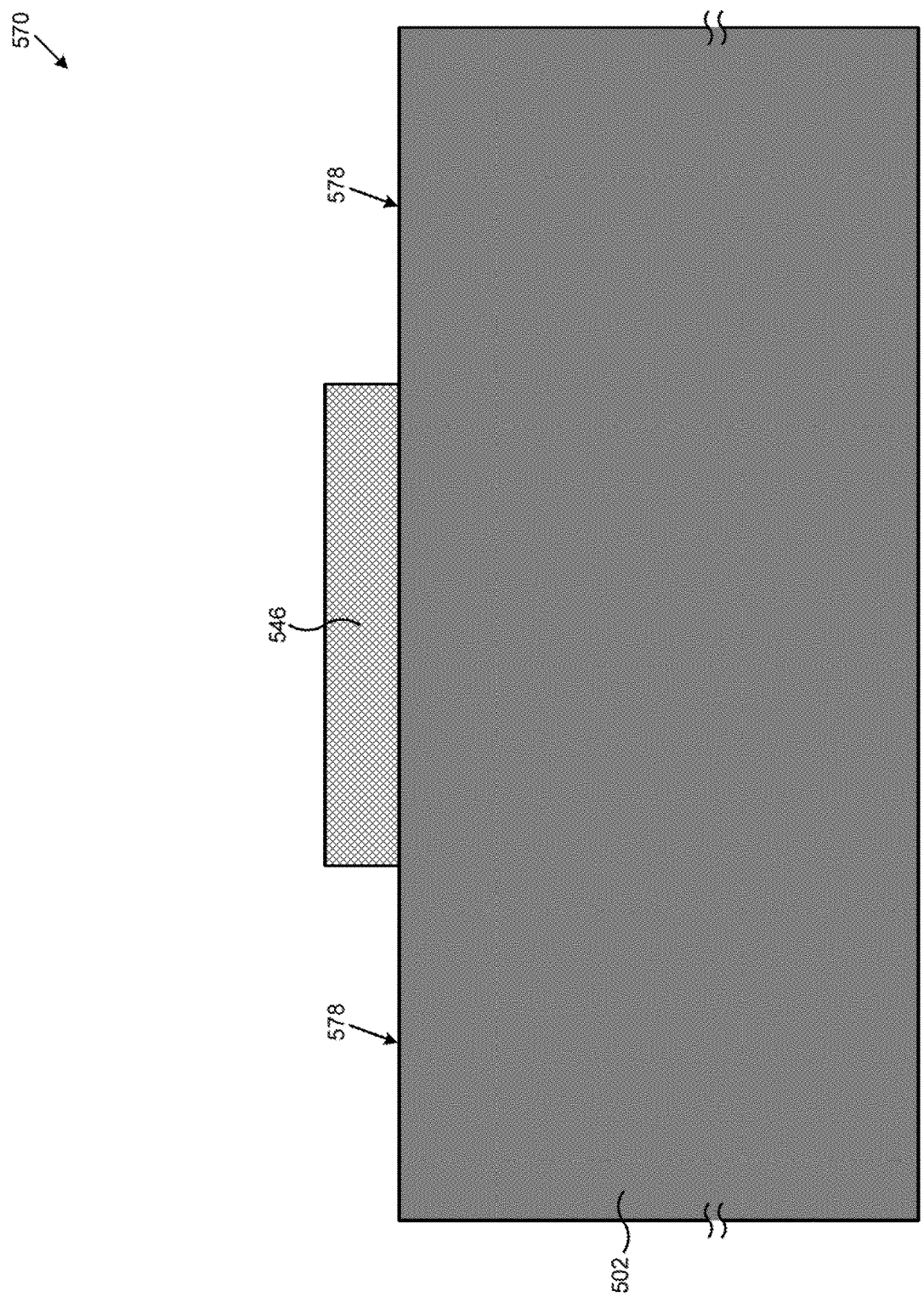
FIG. 5A illustrates a cross-sectional view of a portion of a semiconductor structure processed in accordance with the flowchart of FIG. 4 according to one implementation of the present application.
Figure 5B:
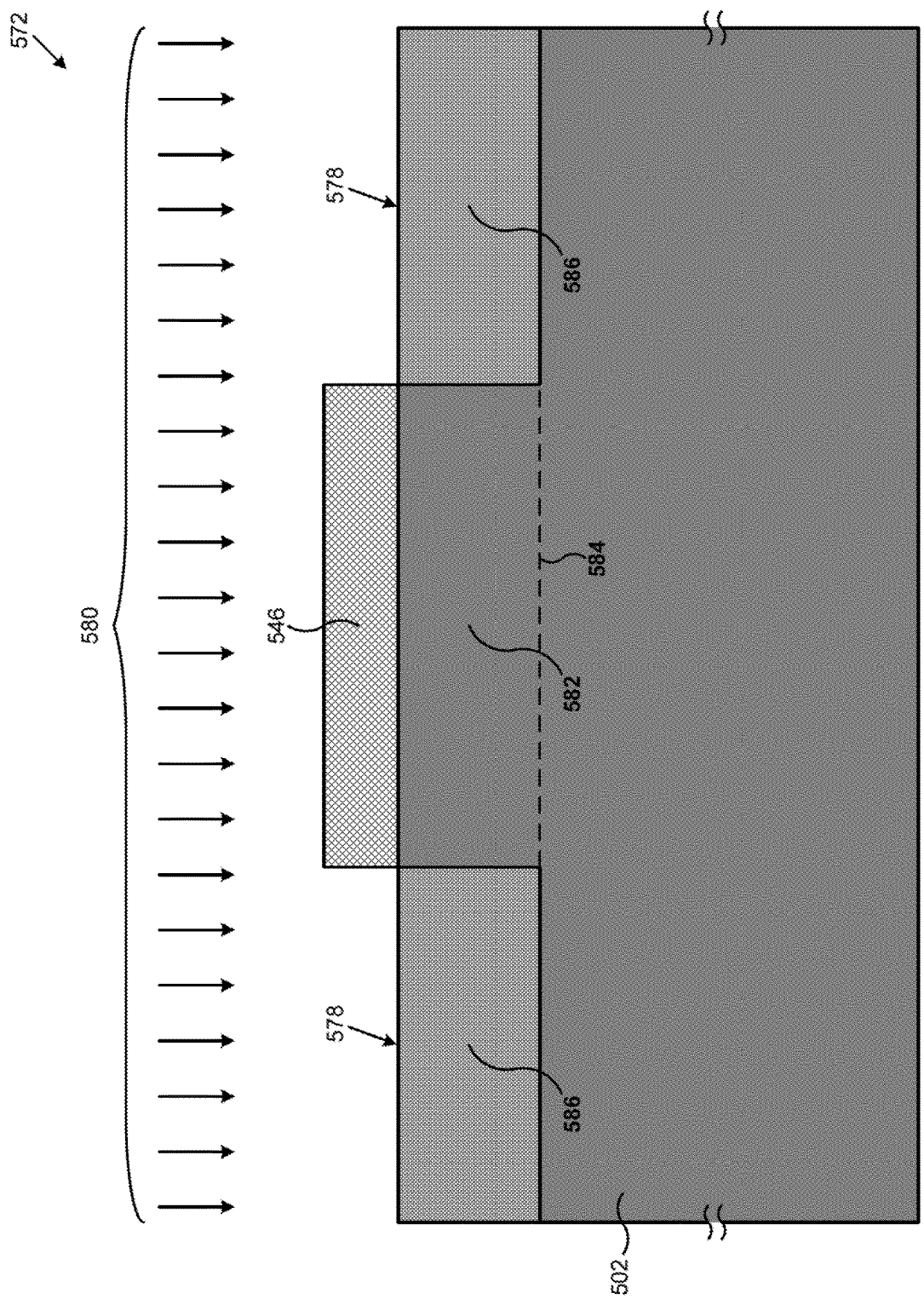
FIG. 5B illustrates a cross-sectional view of a portion of a semiconductor structure processed in accordance with the flowchart of FIG. 4 according to one implementation of the present application.

FIG. 4 illustrates a portion of a flowchart of an exemplary method for manufacturing a semiconductor structure according to one implementation of the present application. Structures shown in FIGS. 5A through 5D illustrate the results of performing actions 470 through 476 shown in the flowchart of FIG. 4. For example, FIG. 5A shows a semiconductor structure after performing action 470 in FIG. 4, FIG. 5B shows a semiconductor structure after performing action 472 in FIG. 4, and so forth.

Actions 470 through 476 shown he flowchart of FIG. 4 are sufficient to describe one implementation of the present inventive concepts. Other implementations of the present inventive concepts may utilize actions different from those shown in the flowchart of FIG. 4. Certain details and features have been left out of the flowchart of FIG. 4 that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 5A illustrates a cross-sectional view of a portion of a semiconductor structure processed in accordance with action 470 in the flowchart of FIG. 4 according to one implementation of the present application. As shown in FIG. 5A, in semiconductor structure 570, photoresist mask 546 is formed over high resistivity silicon substrate 502, leaving exposed surfaces 578 of high resistivity silicon substrate 502.

High resistivity silicon substrate 502 and photoresist mask 546 in FIG. 5A generally corresponds to high resistivity silicon substrate 302 and photoresist mask 346 in FIG. 3A, and can have any implementations and advantages described above. In various implementations, photoresist mask 546 can have a pattern and/or alignment other than shown in FIG. 5A.

FIG. 5B illustrates a cross-sectional view of a portion of a semiconductor structure processed in accordance with action 472 in the flowchart of FIG. 4 according to one implementation of the present application. As shown in FIG. 5A, in semiconductor structure 572, exposed surfaces 578 of high resistivity silicon substrate 502 are implant-damaged to form trap-rich regions 586 adjacent to single crystal region 582 of high resistivity silicon substrate 502.

Implant 580 is used to implant-damage exposed surfaces 578 of high resistivity silicon substrate 502. In various implementations, implant 580 can he argon (Ar), silicon (Si), germanium (Ge), krypton (Kr), xenon (Xe), carbon (C), oxygen (O), and/or nitrogen (N). In one implementation, the implant energy can be approximately three kiloelectronvolts (3 keV), and the implant dosage can be approximately $10^{15}/cm^2$. The depth of trap-rich regions 586 may be changed by adjusting one or more parameters of the implantation process, for example, by changing the implant energy. In various implementations, the depth of trap-rich regions 586 can range from approximately one micron to approximately five microns (1-5 μm).

Implant 580 displaces atoms within high resistivity silicon substrate 502 to form trap-rich regions 586 having defects that interrupt the crystal lattice structure. Thus, trap-rich regions 586 have a high density of electrical charge traps that decrease the mobility of free charge carriers. As described above, trap-rich regions 586 can reduce parasitic capacitance with high resistivity silicon substrate 502, and can prevent formation of a parasitic conduction path in high resistivity silicon substrate 502.

Photoresist mask 546 protects high resistivity silicon substrate 502 during the implant damaging action. Thus, single crystal region 582 of high resistivity silicon substrate 502 is preserved below photoresist mask 546. In FIG. 5B, line 584 illustrates a boundary of single crystal region 582. It is understood that line 584 merely illustrates a conceptual boundary of single crystal region 582, and that single crystal region 582 and high resistivity silicon substrate 502 can be one continuous material. The depth of single crystal region 582 corresponds to the depth of trap-rich regions 586. In various implementations, the depth of single crystal region 582 can range from approximately one micron to approximately five microns (1 μm-5 μm).

Figure 5C:
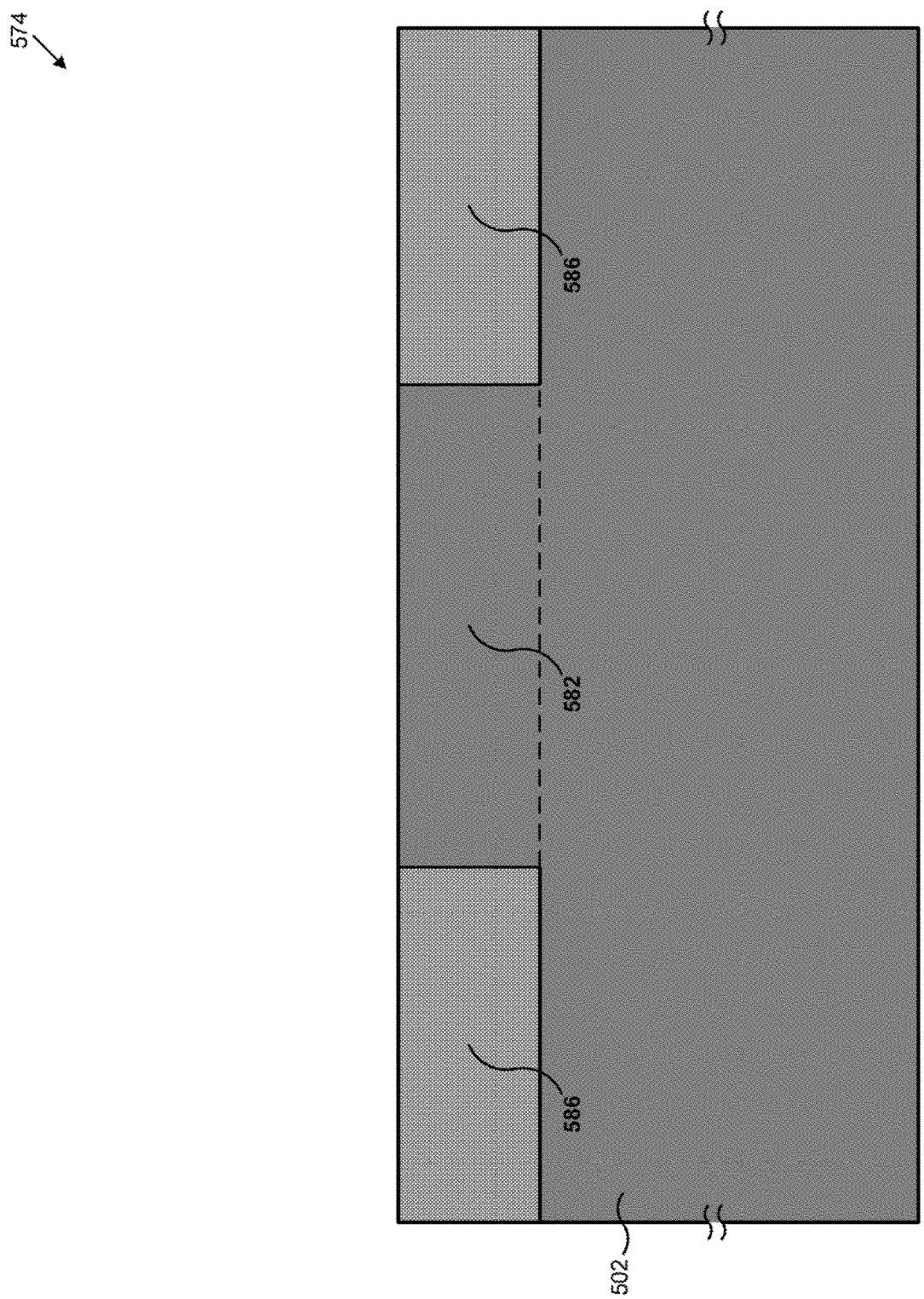
FIG. 5C illustrates a cross-sectional view of a portion of a semiconductor structure processed in accordance with the flowchart of FIG. 4 according to one implementation of the present application

FIG. 5C illustrates a cross-sectional view of a portion of a semiconductor structure processed in accordance with action 474 in the flowchart of FIG. 4 according to one implementation of the present application. As shown in FIG. 5C, in semiconductor structure 574, photoresist mask 546 (shown in FIG. 5B) is removed. Photoresist mask 546 can be removed using any means known in the art, such as wet etching with an organic solvent, or plasma dry etching.

Semiconductor structure 574 includes trap-rich regions 586 adjacent to single crystal region 582 of high resistivity silicon substrate 502. Notably, trap-rich regions 586 are automatically formed substantially coplanar with single crystal region 582 as a result of the implant damaging action (shown in FIG. 5B), and semiconductor structure 574 improves formation of a PCM RF switch in a subsequent action as well as integration of other devices. Although trap-rich regions 586 are illustrated as distinct regions in the cross-sectional view in FIG. 5C, in various implementations, trap-rich regions 586 can be integrally formed as a single trap-rich region connected in a plane not illustrated in FIG. 5C.

Figure 5D:
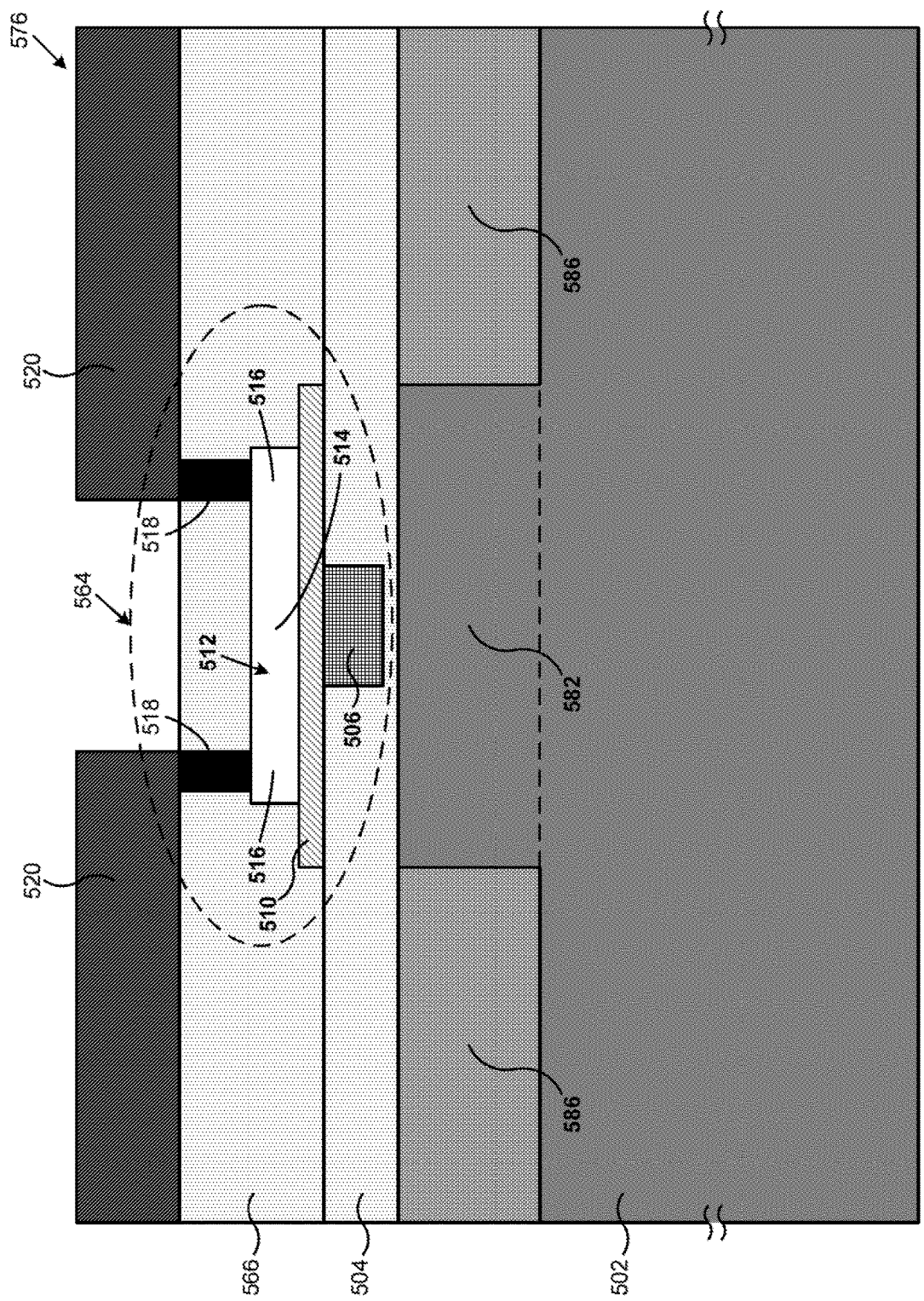
FIG. 5D illustrates a cross-sectional view of a portion of a semiconductor structure processed in accordance with the flowchart of FIG. 4 according to one implementation of the present application.

FIG. 5D illustrates a cross-sectional view of a portion of a semiconductor structure processed in accordance with action 476 in the flowchart of FIG. 4 according to one implementation of the present application. As shown in FIG. 5D, in semiconductor structure 576, PCM RF switch 564 and PCM interconnect segments 520 are formed. Semiconductor structure 576 includes high resistivity silicon substrate 502, single crystal region 582, trap-rich regions 586, lower dielectric 504, PCM RF switch 564, interlayer dielectric 566, and PCM interconnect segments 520. PCM RF switch 564 includes heating element 506, thermally conductive and electrically insulating segment 510. PCM 512 haying active segment 514 and passive segments 516, and PCM contacts 518. Semiconductor structure 576 in FIG. 5D is similar to semiconductor structure 344 in FIG. 3H, and may have any implementations and advantages described above, except for differences described below.

As shown in FIG. 5D, heating element 506 of PCM RF switch 564 is situated over single crystal region 582 of high resistivity silicon substrate 502. In semiconductor structure 576, single crystal region 582 of high resistivity silicon substrate 502 has high thermal conductivity and performs as a heat spreader for PCM RF switch 564. In particular, heat generally transfers faster in single crystal region 582 than in trap-rich regions 586. As also shown in FIG. 5D, portions of PCM interconnect segments 520 are situated over trap-rich regions 586. In semiconductor structure 576, trap-rich regions 586 have high trap density and increase the effective resistance of high resistivity silicon substrate 502. Trap-rich regions 586 significantly reduce capacitance values of parasitic capacitors formed between PCM interconnect segments 520 and high resistivity silicon substrate 502. Further, trap-rich regions 586 significantly decrease the mobility of free charge carriers and harmonic coupling which can propagate across semiconductor structure 576. Because semiconductor structure 576 utilizes trap-rich regions 586 adjacent to single crystal region 582, semiconductor structure 576 significantly improves the frequency response of PCM RF switch 564 in both the ON and OFF states, and significantly reduces harmonic coupling experienced by integrated devices (not shown in FIG. 5D), while still effectively dissipating heat from heating element 506 and reliably transforming active segment 514 of PCM 512.

Thus, various implementations of the present application achieve a semiconductor structure including a highly reliable PCM RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
a semiconductor mesa on a semiconductor substrate:
a trap-rich region adjacent to said semiconductor mesa;
a phase-change material (PCM) radio frequency (RF) switch, wherein a heating element of said PCM RF switch is situated over said semiconductor mesa;
wherein at least a portion of an interconnect segment coupled to said PCM RF switch is situated over said trap-rich region.

2. The semiconductor structure of claim 1, wherein said semiconductor mesa comprises single crystal silicon.

3. The semiconductor structure of claim 1, wherein said semiconductor substrate comprises high resistivity silicon substrate.

4. The semiconductor structure of claim 1, wherein said trap-rich region comprises polycrystalline silicon.

5. The semiconductor structure of claim 1, wherein said semiconductor mesa is a heat spreader for dissipating heat generated by said heating element.

6. The semiconductor structure of claim 1, wherein said PCM RF switch includes a thermally conductive and electrically insulating segment situated over said heating element.

7. The semiconductor structure of claim 1, wherein said PCM RF switch includes a PCM selected from the group consisting of germanium telluride ($Ge_XTe_Y$), germanium antimony telluride ($Ge_XSb_YTe_Z$), germanium selenide ($Ge_XSe_Y$), and any other chalcogenide.

8. A method comprising:
etching a semiconductor substrate to form a semiconductor mesa on said semiconductor substrate;
forming a trap-rich layer over said semiconductor mesa and said semiconductor substrate;
removing said trap-rich layer from a top surface of said semiconductor mesa to form a trap-rich region adjacent to said semiconductor mesa;
forming a phase-change material (PCM) radio frequency (RF) switch, wherein a heating element of said PCM RF switch is situated over said semiconductor mesa;
forming an interconnect segment coupled to said PCM RF switch, wherein at least a portion of said interconnect segment is situated over said trap-rich region.

9. The method of claim 8, further comprising, prior to said forming said trap-rich layer:
forming an oxide layer over said semiconductor mesa and said semiconductor substrate;
removing said oxide layer.

10. The method of claim 8, wherein said PCM RF switch includes a thermally conductive and electrically insulating segment situated over said heating element.

11. A semiconductor structure comprising:
a trap-rich region adjacent to a single crystal region of a semiconductor substrate;
a phase-change material (PCM) radio frequency (RF) switch, wherein a heating element of said PCM RF switch is situated over said single crystal region;
wherein at least a portion of an interconnect segment coupled to said PCM RF switch is situated over said trap-rich region.

12. The semiconductor structure of claim 11, wherein said single crystal region comprises single crystal silicon.

13. The semiconductor structure of claim 11, wherein said semiconductor substrate comprises high resistivity silicon substrate.

14. The semiconductor structure of claim 11, wherein said trap-rich region comprises implant-damaged silicon.

15. The semiconductor structure of claim 11, wherein said single crystal region is a heat spreader for dissipating heat generated by said heating element.

16. The semiconductor structure of claim 11, wherein said PCM RF switch includes a thermally conductive and electrically insulating segment situated over said heating element.

17. The semiconductor structure of claim 11, wherein said PCM RF switch includes a PCM selected from the group consisting of germanium telluride ($Ge_XTe_Y$), germanium antimony telluride ($Ge_XSb_YTe_Z$), germanium selenide ($Ge_XSe_Y$), and any other chalcogenide.

18. A method comprising:
forming a mask over a semiconductor substrate;
implant damaging an exposed surface of said semiconductor substrate to form a trap-rich region adjacent to a single crystal region of said semiconductor substrate;
removing said mask;
forming a phase-change material (PCM) radio frequency (RF) switch, wherein a heating element of said PCM RF switch is situated over said single crystal region;
forming an interconnect segment coupled to said PCM RF switch, wherein at least a portion of said interconnect segment is situated over said trap-rich region.

19. The method of claim 18, wherein said implant damaging uses an implant selected from the group consisting of argon (Ar), silicon (Si), germanium (Ge), krypton (Kr), xenon (Xe), carbon (C), oxygen (O), and nitrogen (N).

20. The method of claim 18, wherein said PCM RF switch includes a thermally conductive and electrically insulating segment situated over said heating element.

* * * * *